United States Patent
Yi et al.

(10) Patent No.: US 10,256,192 B2
(45) Date of Patent: Apr. 9, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Moon Hee Yi, Suwon-si (KR); Byoung Chan Kim, Suwon-si (KR); Yong Ho Baek, Suwon-si (KR); Jung Hyun Cho, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/663,042

(22) Filed: Jul. 28, 2017

(65) Prior Publication Data
US 2018/0145033 A1 May 24, 2018

(30) Foreign Application Priority Data
Nov. 23, 2016 (KR) .................. 10-2016-0156779

(51) Int. Cl.
H01L 23/538 (2006.01)
H01L 21/48 (2006.01)
(Continued)

(52) U.S. Cl.
CPC ........ *H01L 23/5389* (2013.01); *H01L 21/486* (2013.01); *H01L 23/49827* (2013.01);
(Continued)

(58) Field of Classification Search
CPC . H01L 23/5389; H01L 24/19; H01L 23/5384; H01L 24/25; H01L 24/24;
(Continued)

(56) References Cited

U.S. PATENT DOCUMENTS 7,872,343 B1 * 1/2011 Berry .................. H01L 21/561
257/687
7,935,570 B2 5/2011 Lin et al.
(Continued)

FOREIGN PATENT DOCUMENTS

JP 2004-363566 A 12/2004
JP 2012-039090 A 2/2012
(Continued)

OTHER PUBLICATIONS

Korean Office Action dated Oct. 29, 2018 issued in Korean Patent Application No. 10-2016-0156779 (with English translation).

*Primary Examiner* — Cuong B Nguyen
(74) *Attorney, Agent, or Firm* — Morgan Lewis & Bockius LLP

(57) ABSTRACT

A fan-out semiconductor package includes a first connection member having a through-hole, a semiconductor chip disposed in the through-hole, at least one component-embedded substrate disposed adjacent the semiconductor chip in the through-hole and spaced apart from the semiconductor chip by a predetermined distance and having a plurality of passive components embedded therein, an encapsulant encapsulating at least portions of the first connection member, the at least one component-embedded substrate, and the semiconductor chip, and a second connection member disposed on the first connection member, the at least one component-embedded substrate, and the semiconductor chip. The first and second connection members each include redistribution layers electrically connected to the connection pads of the semiconductor chip, and the plurality of passive components embedded in the at least one component-embedded substrate are electrically connected to the connection pads of the semiconductor chip through the redistribution layer of the second connection member.

23 Claims, 12 Drawing Sheets

(51) Int. Cl.
*H01L 23/498* (2006.01)
*H01L 23/00* (2006.01)

(52) U.S. Cl.
CPC .... *H01L 23/49838* (2013.01); *H01L 23/5384* (2013.01); *H01L 24/02* (2013.01); *H01L 24/13* (2013.01); *H01L 24/19* (2013.01); *H01L 24/20* (2013.01); *H01L 24/24* (2013.01); *H01L 24/25* (2013.01); *H01L 2224/02379* (2013.01); *H01L 2224/02381* (2013.01); *H01L 2224/13024* (2013.01); *H01L 2224/16225* (2013.01); *H01L 2224/24137* (2013.01); *H01L 2224/24195* (2013.01); *H01L 2224/25171* (2013.01); *H01L 2224/32225* (2013.01); *H01L 2224/73204* (2013.01); *H01L 2924/18162* (2013.01); *H01L 2924/19105* (2013.01)

(58) Field of Classification Search
CPC ....... H01L 24/02; H01L 21/486; H01L 24/13; H01L 23/49838; H01L 23/49827; H01L 2224/02381; H01L 2224/02379; H01L 2924/19105; H01L 2224/25171; H01L 2224/24195; H01L 2224/13024; H01L 2224/24137

See application file for complete search history.

(56) References Cited

U.S. PATENT DOCUMENTS

| | | | |
|---|---|---|---|
| 9,368,563 | B2 | 6/2016 | Lin et al. |
| 2004/0227258 | A1 | 11/2004 | Nakatani |
| 2012/0013021 | A1 | 1/2012 | Kobayashi et al. |
| 2014/0252595 | A1* | 9/2014 | Yen ........................ H01L 23/498 257/737 |
| 2018/0114758 | A1* | 4/2018 | Yao ........................ H01L 23/552 |

FOREIGN PATENT DOCUMENTS

| | | |
|---|---|---|
| KR | 10-2013-0132163 A | 4/2013 |
| KR | 10-2015-0024944 A | 3/2015 |

\* cited by examiner

FAN-OUT SEMICONDUCTOR PACKAGE

CROSS-REFERENCE TO RELATED APPLICATION(S)

This application claims priority under 35 U.S.C. § 119 to Korean Patent Application No. 10-2016-0156779 filed on Nov. 23, 2016, in the Korean Intellectual Property Office (KIPO), the disclosure of which is incorporated herein by reference in its entirety.

BACKGROUND

1. Field

The present disclosure relates to a semiconductor package, and more particularly, to a fan-out semiconductor package in which connection terminals may extend outwardly of a region in which a semiconductor chip is disposed.

2. Description of Related Art

Recently, a trend in the development of technology related to semiconductor chips has been to reduce the size of semiconductor chips. Therefore, in the field of package technology, due to an increased demand for smaller size semiconductor chips, semiconductor packages are increasingly compact in size, while including an increased number of pins.

One type of package technology suggested to satisfy the technical demand as described above is a fan-out package. Such a fan-out package has a compact size and may allow a plurality of pins to be implemented by redistributing connection terminals outwardly from a region in which a semiconductor chip is disposed.

SUMMARY

An aspect of the present disclosure may provide a fan-out semiconductor package in which a plurality of passive components may be mounted together with a semiconductor chip, a size and a thickness of the package may be reduced, even though the number (quantity) of the plurality of passive components mounted along with the semiconductor chip is increased. Further, manufacturing costs and a defect rate may be minimized.

According to an aspect of the present disclosure, a fan-out semiconductor package may be provided, in which a component-embedded substrate having a plurality of passive components embedded therein is disposed adjacent a semiconductor chip and is packaged.

According to an aspect of the present disclosure, a fan-out semiconductor package may include: a first connection member having a through-hole, a semiconductor chip disposed in the through-hole of the first connection member and having an active surface having connection pads disposed thereon and an inactive surface opposing the active surface, at least one component-embedded substrate disposed adjacent the semiconductor chip in the through-hole of the first connection member and spaced apart from the semiconductor chip by a predetermined distance and including a plurality of passive components embedded therein, an encapsulant encapsulating at least a portion of the first connection member, the at least one component-embedded substrate, and the semiconductor chip, and a second connection member disposed on the first connection member, the at least one component-embedded substrate, and the active surface of the semiconductor chip. The first connection member and the second connection member include, respectively, redistribution layers electrically connected to the connection pads of the semiconductor chip, and the plurality of passive components embedded in the at least one component-embedded substrate are electrically connected to the connection pads of the semiconductor chip through the redistribution layer of the second connection member.

BRIEF DESCRIPTION OF DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, refer to a direction toward a mounted surface of the fan-out semiconductor package illustrated in FIGS. 1-17, and an upper side, an upper portion, an upper surface, and the like, refer to an opposite direction (e.g., away from the mounted surface of the fan-out semiconductor package) illustrated in FIGS. 1-17. However, these directions/orientations are defined for sake of explanation, and the claims are not particularly limited by the directions defined as described above.

As used herein, a "connection" of a first component with a second component, and any variations thereof, include an indirect connection between the first and second components through one or more other components (e.g., an adhesive layer) as well as a direct connection between the first and second components. As used herein, "electrically connected" and any variations thereof refer to a physical connection and a physical disconnection. It can be understood that when an element is referred to using terms such as "first" and "second", the element is not limited thereby. They may only be used for a purpose of distinguishing the elements from each other, and may not limit the sequence or importance of the elements. In some cases, a first element may be referred to as a second element without departing from the scope of the disclosure. Similarly, a second element may also be referred to as a first element without departing from the scope of the disclosure.

As used herein, "an exemplary embodiment," and any variations thereof, may not refer to the same exemplary embodiment, and is used herein to emphasize a particular feature or characteristic different from another exemplary embodiments disclosed herein. However, exemplary embodiments provided herein may be combined in whole or in part with one or more other disclosed exemplary embodiments. For example, an element described in an exemplary embodiment, may be included in another exemplary embodiment even if not explicitly described therein, unless an opposite or contradictory description is provided.

Terms used herein are used only in order to describe an exemplary embodiment rather than limiting the present disclosure. In this case, singular forms include plural forms unless interpreted otherwise in context.

Electronic Device

Figure 1:
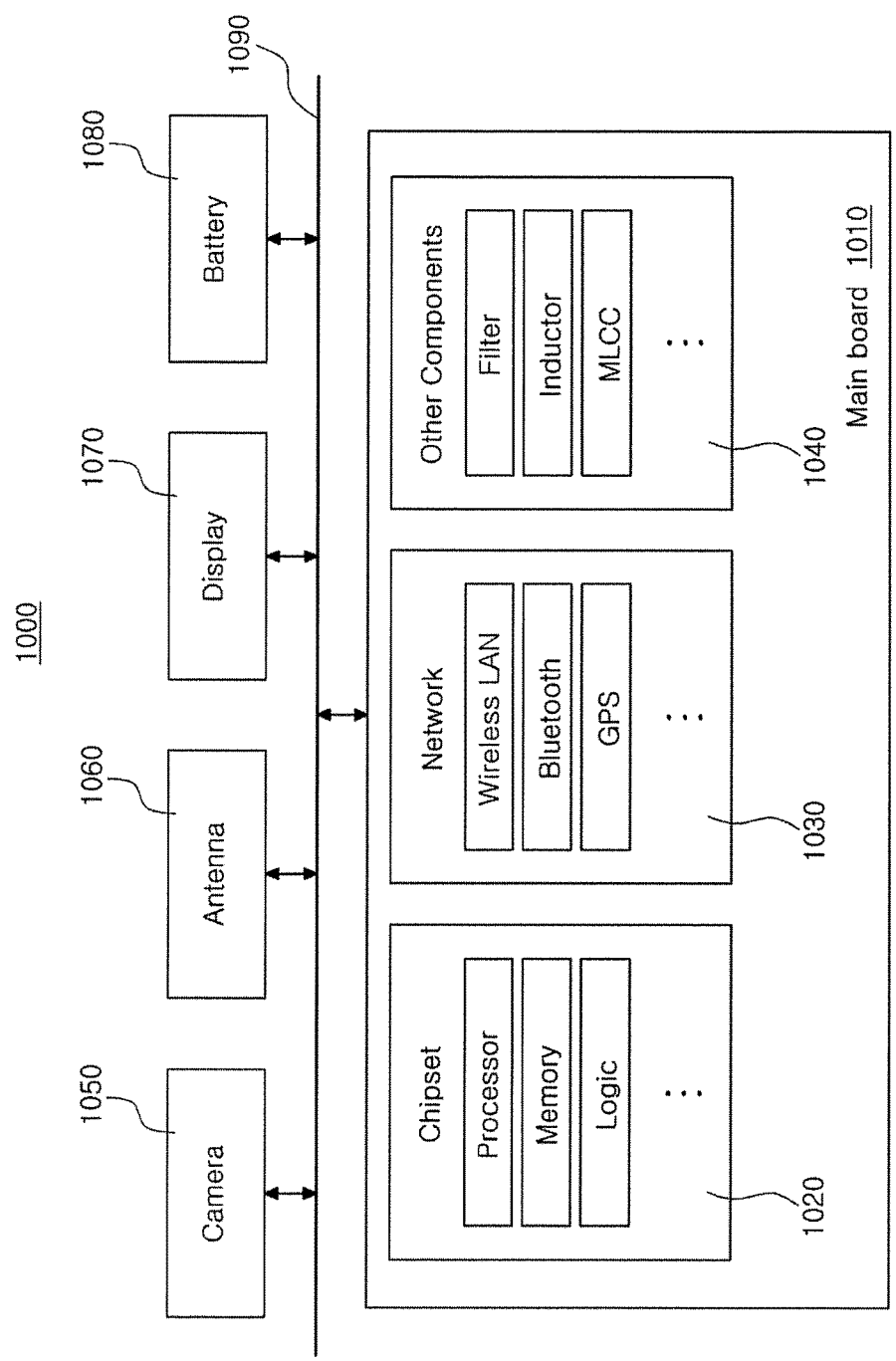
FIG. 1 is a schematic block diagram illustrating an example of an electronic device system.

FIG. 1 is a block diagram illustrating an electronic device system.

Referring to FIG. 1, an electronic device 1000 may include a main board (or motherboard) 1010 having chip related components 1020, network related components 1030, electrical components 1040, and the like, connected thereto. In an example and as illustrated, the chip-related components 1020, the network-related components 1030, and the electrical components 1040 may be considered as "on-board" components that are installed on the main board 1010, as opposed to other electrical components that may be external to the main board 1010 and electrically connected thereto via signal lines 1090. The chip-related components 1020, network-related components 1030, and the electrical components 1040 may be connected to each other and to the other external components of the main board 1010 via signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), a combination thereof, and the like. However, the chip related components 1020 are not limited thereto, and may also include other types of chip related components, without departing from the scope of the disclosure. In addition, although illustrated as discreet components, two or more the chip related components 1020 may be combined with each other.

The network related components 1030 may include one or more electronic components for implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols, a combination thereof, and the like. However, the network related components 1030 are not limited thereto, and may also include a variety of other wireless or wired standards or protocols, without departing from the scope of the disclosure. In addition, although illustrated as discreet components, the network related components 1030 may be combined with each other, and may further be combined with the chip related components 1020.

Electrical components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), a combination thereof, and the like. However, the electrical components 1040 are not limited thereto, and may also include passive components used for various other purposes, or the like. In addition, two or more electrical components 1040 may be combined with each other, or one or more electrical components 1040 may be combined with the chip related components 1020 and/or the network related components 1030.

Depending on a type of the electronic device 1000, and as discussed above, the electronic device 1000 may include electrical components that may be external to the main board 1010. These electrical components may include, for example, a camera module 1050, an antenna 1060, a display device 1070, and a battery 1080. Although not illustrated, other external electrical components may be or include an audio codec, a video codec, a power amplifier, a compass, an accelerometer, a gyroscope, a speaker, a mass storage unit (for example, a hard disk drive), a compact disk (CD) drive, a digital versatile disk (DVD) drive, a combination thereof, and the like. It will be understood that the components in the electronic device 1000 are not limited thereto, and the electronic component 1000 may include other components depending on the application and user requirement.

In an example, the electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, a combination thereof, and the like. However, the electronic device 1000 is not limited thereto, and may be or include other electronic data processing devices.

Figure 2:
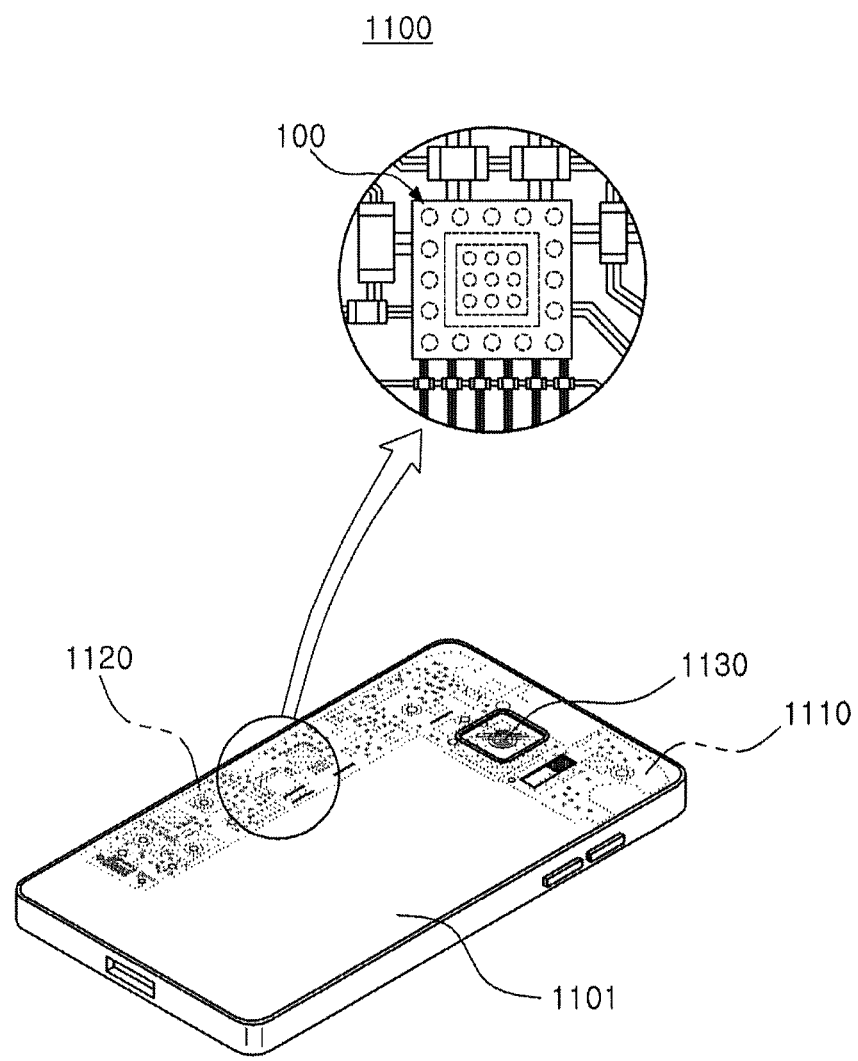
FIG. 2 is a schematic perspective view of an electronic device.

FIG. 2 is a schematic perspective view of an example electronic device 1100. In an embodiment, the electronic device 1100 may be or include one or more of the electronic devices 1000 mentioned above.

Referring to FIG. 2, a semiconductor package may be used for various purposes in the various electronic devices 1000 as described above. For example, a main board 1110 may be accommodated in a body 1101 of the electronic device 1100, which, as illustrated, may be a smartphone, and various electronic components 1120 may be physically or electrically connected to the main board 1110. However, the electronic device 1100 is not limited thereto. In addition, other components that may or may not be physically or electrically connected to the main board 1110, such as a camera module 1130, may be accommodated in the body 1101. Some of the electronic components 1120 may be the chip related components, for example, an application processor, signal processor, etc. However, the electronic components 1120 are not limited thereto.

Semiconductor Package

Generally, multiple electrical circuits are integrated in a semiconductor chip. The semiconductor chip may be damaged due to external physical or chemical impacts. Therefore, the semiconductor chip may be packaged before using in an electronic device.

Here, semiconductor packaging may be required due to a difference in size of electrical connections between the semiconductor chip and a main board of the electronic device. In detail, a size of connection pads of the semiconductor chip and intervals between the connection pads of the semiconductor chip are substantially smaller than sizes of component mounting pads of the main board and intervals between the component mounting pads of the main board. Therefore, it may be difficult to directly mount the semiconductor chip on the main board, and packaging technology may reduce a difference in the size of the connections between the semiconductor chip and the main board.

A semiconductor package manufactured using the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
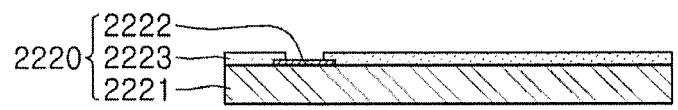
FIG. 3A is a schematic cross-sectional view of a fan-in semiconductor package prior to being packaged.
Figure 3B:
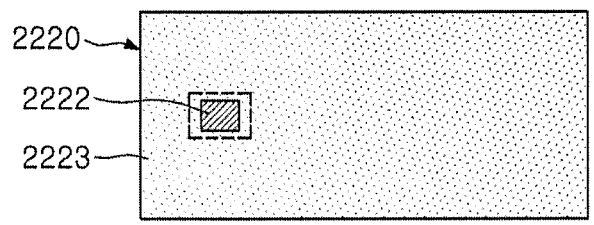
FIG. 3B illustrates a plan view of the fan-in semiconductor package of FIG. 3A.
Figure 3C:
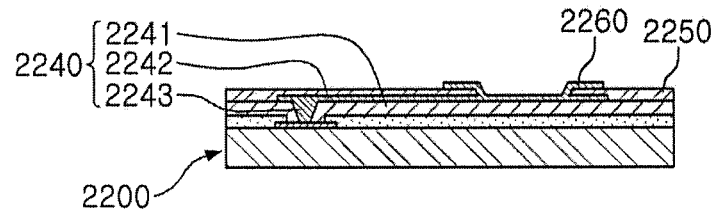
FIG. 3C is a schematic cross-sectional view of the fan-in semiconductor package of FIGS. 3A and 3B after being packaged.
Figure 3D:
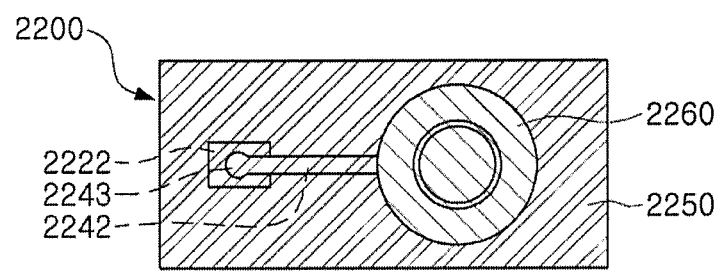
FIG. 3D illustrates a plan view of the fan-in semiconductor package of FIG. 3C.

FIG. 3A is a schematic cross-sectional view of a fan-in semiconductor package prior to being packaged. FIG. 3B illustrates a plan view of the fan-in semiconductor package of FIG. 3A. FIG. 3C is a schematic cross-sectional view of the fan-in semiconductor package of FIGS. 3A and 3B after being packaged. FIG. 3D illustrates a plan view of the fan-in semiconductor package of FIG. 3C.

FIGS. 4A-4G illustrate the processing steps for manufacturing the fan-in semiconductor package in FIGS. 3C-3D.

Referring to FIGS. 3A-3D and 4A-4G, a semiconductor chip 2220 may be, for example, an integrated circuit (IC), having a body 2221 including silicon (Si), germanium (Ge), gallium arsenide (GaAs), a combination thereof, and the like, connection pads 2222 formed on one surface of the body 2221 and including a conductive material such as aluminum (Al), or the like, and a passivation layer 2223 such as an oxide film, a nitride film, a combination thereof, and the like, formed on one surface of the body 2221 and at least partially covering the connection pads 2222. Since the connection pads 2222 are relatively smaller in size, it may be difficult to mount the integrated circuit (IC) on an intermediate printed circuit board (PCB) as well as on the main board of the electronic device.

Figure 4A:
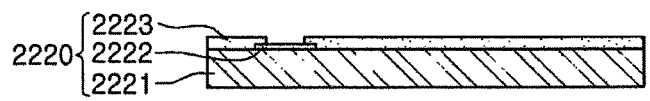
FIGS. 4A-4G illustrate the processing steps for manufacturing the fan-in semiconductor package in FIGS. 3C-3D.
Figure 4B:
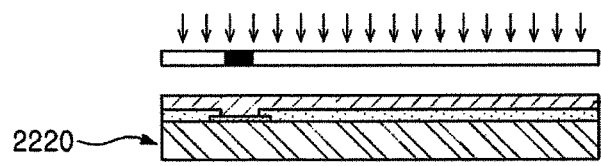
Figure 4C:
Figure 4D:
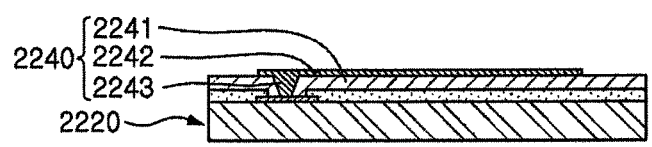

Therefore, an connection member 2240 may be formed on the semiconductor chip 2220, depending on a size of the semiconductor chip 2220, in order to redistribute the connection pads 2222. FIG. 4A illustrates the fan-in semiconductor package of FIG. 3A. Referring to FIGS. 4B, 4C and 4D, to form the connection member 2240, an insulating layer 2241 may be deposited on the semiconductor chip 2220. More specifically, the insulating layer 2241 may be deposited over the passivation layer 2223 and the connection pads 2222. The insulating later 2241 may include an insulating material such as a photoimagable dielectric (PID) resin. As illustrated in FIGS. 4B and 4C, a via hole 2243h may then be formed in the insulating layer 2241 using photolithography and etching processes. Briefly, light 2217 of a specific wavelength is shined over the insulating layer 2241 through a mask 2215 having a pattern of the via hole 2243h formed therein. The etching process may be performed to remove the insulating layer 2241 to form the via 2243 (FIG. 4D).

Figure 4E:
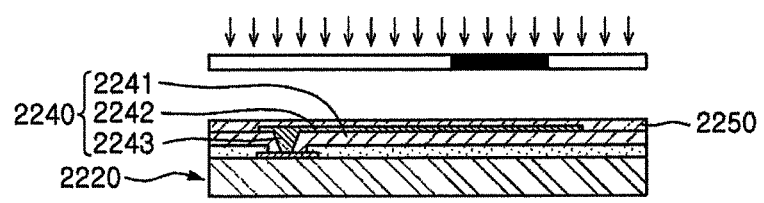
Figure 4F:
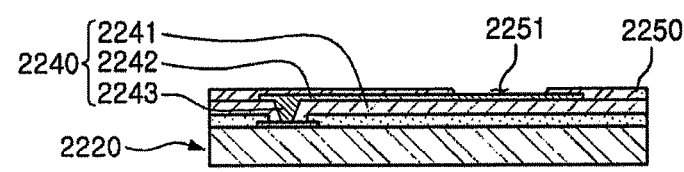

As illustrated in FIG. 4D, wiring patterns 2242 may then be formed on the insulating layer 2241 and in the via 2243 to connect to the connection pads 2222. Referring to FIGS. 4E and 4F, a passivation layer 2250 protecting the connection member 2240 may be formed, and photolithography and etching processes may be performed again to form an opening 2251 in the passivation layer 2250. Briefly, the photolithography and etching processes may include shining light on the passivation layer 2250 via a mask 2219 including a pattern corresponding to the opening 2251. The passivation layer 2250 is then etched away to form the opening 2251 and expose the underlying wiring patterns 2242.

Figure 4G:
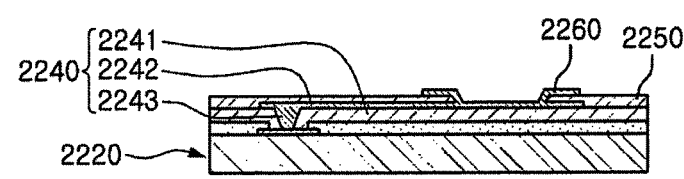

As illustrated in FIG. 4G, an under-bump metal layer 2260 may be deposited in the opening 2251, and the fan-in semiconductor package of FIG. 3D may be obtained. Thus, a fan-in semiconductor package 2200 including the semiconductor chip 2220, the connection member 2240, the passivation layer 2250, and the under-bump metal layer 2260 may be manufactured through multiple processing steps.

As described above, in the fan-in semiconductor package, all of the connection pads 2222, which, for example, may be used as input/output (I/O) terminals of the semiconductor chip 2220, are disposed inside the semiconductor chip 2220. As a result, the fan-in semiconductor package may have improved electrical characteristics and may be produced at a low cost. Due to the low cost and improved electrical characteristics, a variety of portable electronic devices, such as smartphones, media players, and the like, include components m manufactured in a fan-in semiconductor package form. Such components allow faster signal transfer and have a compact size.

Because of the relatively small size of the connection pads 2222 and the small interval (or separation) between adjacent connection pads 2222 of the semiconductor chip, an intermediate circuit (also referred to as an interposer substrate) may be used to mount the fan-in semiconductor package on the main board (e.g., main board 1010 in FIG. 1) of the electronic device.

Figure 5:
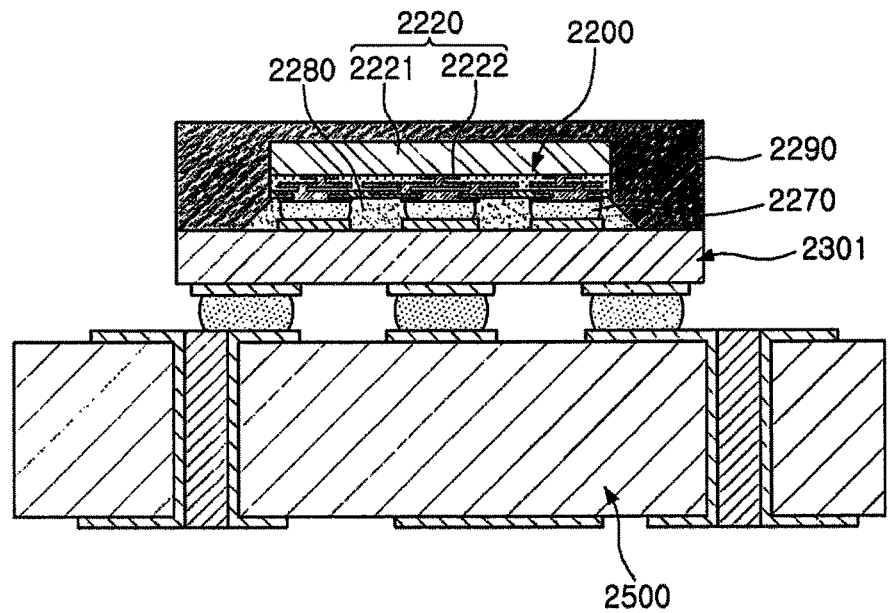
FIG. 5 is a schematic cross-sectional view of a fan-in semiconductor package mounted on an interposer substrate and which is mounted on a main board of an electronic device.

FIG. 5 is a schematic cross-sectional view of a fan-in semiconductor package mounted on an interposer substrate and which is then mounted on a main board of an electronic device.

Figure 6:
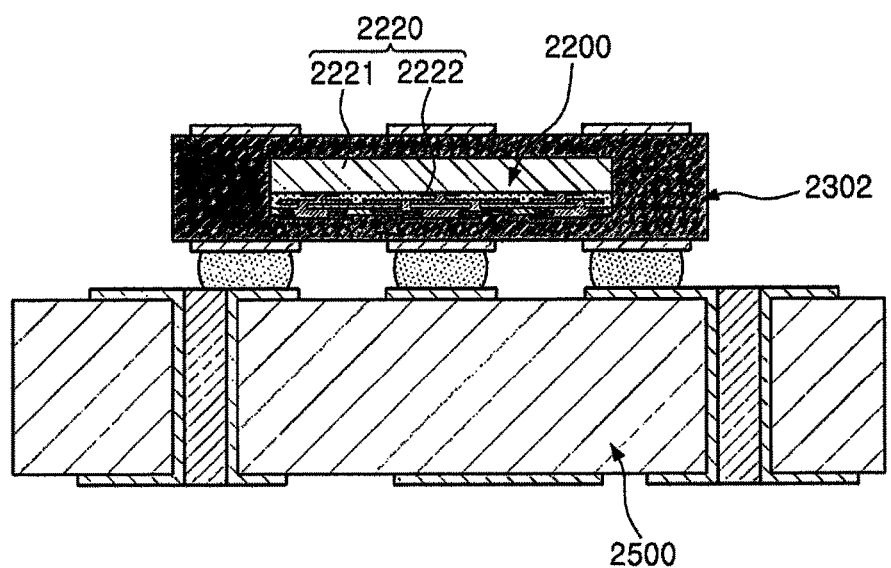
FIG. 6 is a schematic cross-sectional view of a fan-in semiconductor package embedded in an interposer substrate and which is mounted on a main board of an electronic device.

FIG. 6 is a schematic cross-sectional view of a fan-in semiconductor package embedded in an interposer substrate and which is then mounted on a main board of an electronic device.

Referring to FIGS. 5 and 6, and with continued reference to FIGS. 3A-3D and 4, in a fan-in semiconductor package 2200, the connection pads 2222 of the semiconductor chip 2220 may again be redistributed through an interposer substrate 2301, and the fan-in semiconductor package 2200 may be mounted on a main board 2500 of an electronic device by mounting the fan-in semiconductor package 2200 on the interposer substrate 2301. In this case, solder balls 2270, and the like, may be fixed to the semiconductor package 2220 by an underfill resin 2280, or the like. The external surface of the semiconductor chip 2220 may be covered with a molding material 2290. Alternatively, as illustrated in FIG. 6, in order to redistribute the connection pads 2222 of the semiconductor chip 2220, the fan-in semiconductor package 2200 may be embedded in an interposer substrate 2302, and the fan-in semiconductor package 2200 may then be mounted on a main board 2500 of an electronic device.

Thus, connection pads 2222 having a relatively small size and small interval (or separation) may be connected to the main board of the electronic device.

Fan-Out Semiconductor Package

Figure 7:
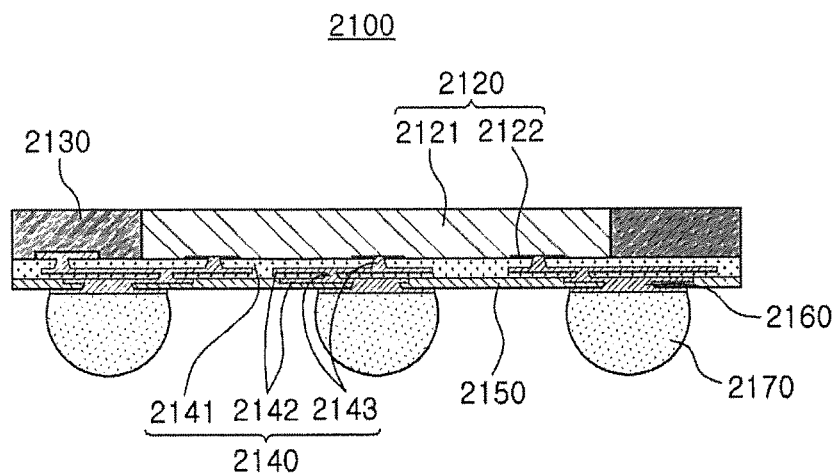
FIG. 7 is a schematic cross-sectional view of a fan-out semiconductor package.

FIG. 7 is a schematic cross-sectional view illustrating a fan-out semiconductor package 2100.

Referring to FIG. 7, the fan-out semiconductor package 2100 may include a semiconductor chip 2120 having a body 2121 that is protected by an encapsulant 2130. The connection pads 2122 of the semiconductor chip 2120 may be redistributed externally (or otherwise "brought" to the outside) of the semiconductor chip 2120 by an interconnection member 2140. As illustrated, a passivation layer 2150 may be formed on or otherwise deposited on the interconnection member 2140, and an under-bump metal layer 2160 may be formed or otherwise deposited in openings of the passivation layer 2150. Solder balls 2170 may be formed or otherwise deposited on the under-bump metal layer 2160. The connection member 2140 may include an insulating layer 2141, redistribution layers 2142 formed on the insulating layer 2141, and vias 2143 electrically connecting the connection pads 2122 and the redistribution layers 2142 with each other.

As described above, in the fan-in semiconductor package, all connection pads of the semiconductor chip may be disposed inside the semiconductor chip. Therefore, when a size of the semiconductor chip is reduced, a size and a pitch of balls may also be reduced, and, therefore, a non-standardized ball layout may be used in the fan-in semiconductor package. On the other hand, in the fan-out semiconductor package disclosed in FIG. 7, the connection pads (I/O terminals) of the semiconductor chip are redistributed external to the semiconductor chip through the interconnection member formed on the semiconductor chip. Therefore, even if a size of the semiconductor chip is reduced, it may be possible to use a standardized ball layout in the fan-out semiconductor package. Thus, an interposer may not be required to mount the fan-out semiconductor package on the main board of the electronic device, as described below.

Figure 8:
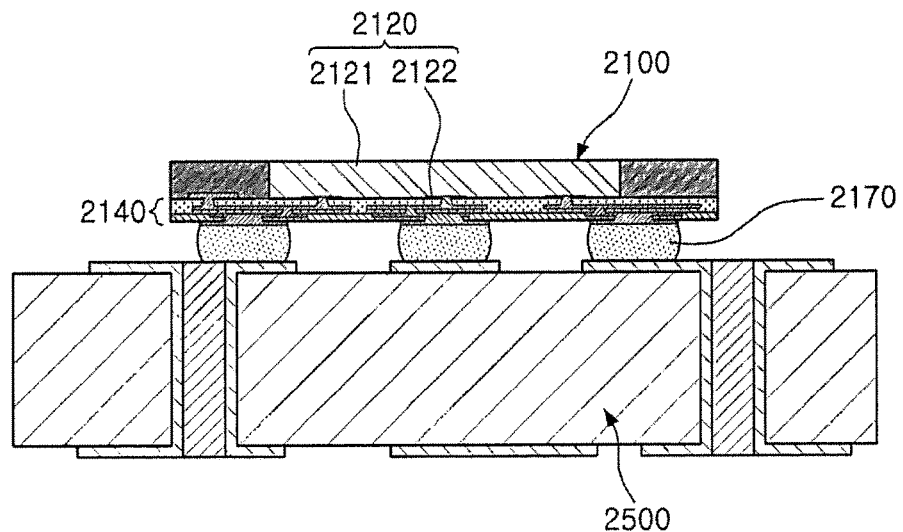
FIG. 8 is a schematic cross-sectional view of a fan-out semiconductor package mounted on a main board of an electronic device.

FIG. 8 is a schematic cross-sectional view of the fan-out semiconductor package 2100 mounted on a main board 2500 of an electronic device.

Referring to FIG. 8, the fan-out semiconductor package 2100 may be mounted on the main board 2500 of an electronic device using solder balls 2170, or similar connectors. The fan-out semiconductor package 2100 includes the connection member 2140 formed on the semiconductor chip 2120 for redistributing the connection pads 2122 to a fan-out region having an area greater than that of the semiconductor chip 2120, such that a standardized ball layout may be used in the fan-out semiconductor package 2100. As a result, the fan-out semiconductor package 2100 may be mounted on the main board 2500 of the electronic device without using a separate interposer substrate.

As described above, since the fan-out semiconductor package may be mounted on the main board of the electronic device without using the separate interposer substrate, a thickness of the fan-out semiconductor package may lower than that of the fan-in semiconductor package using the interposer substrate. As a result, a size of the fan-out semiconductor package may be reduced. In addition, the fan-out semiconductor package has improved thermal characteristics and electrical characteristics, and a use thereof in a mobile device (e.g., smartphone) may be desirable. Thus, the fan-out semiconductor package may be relatively more compact than a general package-on-package (POP) type using a printed circuit board (PCB) and warpage phenomenon may be avoided.

As discussed above, in the fan-out semiconductor package, the semiconductor chip is mounted on the main board of the electronic device, and the semiconductor chip is protected from external impacts. In contrast, the fan-in semiconductor package is embedded in an interposer substrate, which is then mounted on the main board of the electronic device.

A fan-out semiconductor package including a plurality of passive components mounted along with a semiconductor chip will hereinafter be described. Although package includes the plurality of passive components along with the semiconductor chip, a size and a thickness of the package are reduced, and mounting costs and a defect rate are also reduced.

Figure 9:
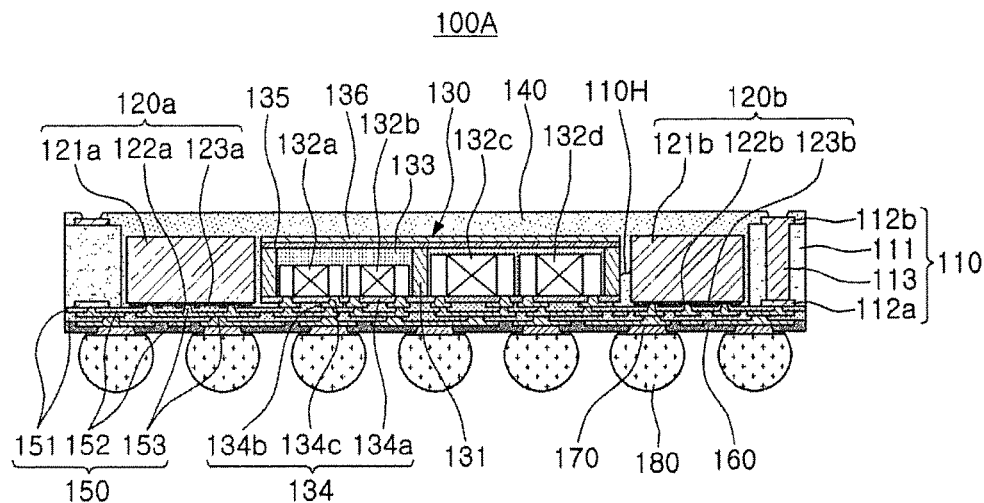
FIG. 9 is a schematic cross-sectional view of an example fan-out semiconductor package.

FIG. 9 is a schematic cross-sectional view of an example fan-out semiconductor package 100A.

Figure 10:
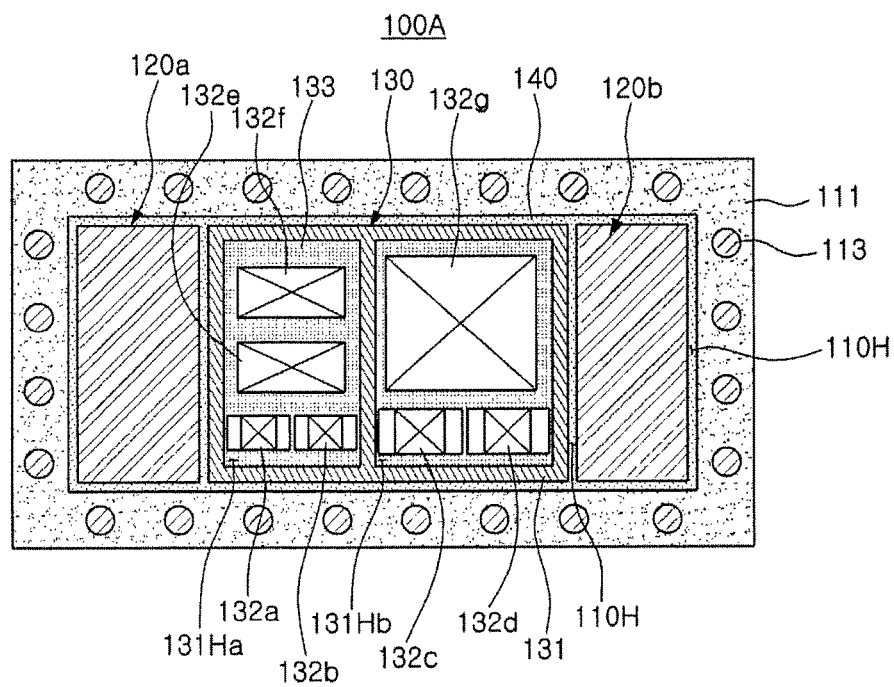
FIG. 10 is a schematic plan view of the fan-out semiconductor package of FIG. 9.

FIG. 10 is a schematic plan view of the fan-out semiconductor package 100A of FIG. 9, according to exemplary embodiments disclosed.

Referring to FIGS. 9 and 10, the fan-out semiconductor package 100A may include a first connection member 110 having a through-hole 110H, and a first semiconductor chip 120a and a second semiconductor chip 120b disposed in the through-hole 110H. The fan-out semiconductor package 100A may further include a component-embedded substrate 130 disposed between the first semiconductor chip 120a and the second semiconductor chip 120b in the through-hole 110H and spaced apart therefrom by a predetermined distance. However, in other embodiments, one of the first or second semiconductor chips 120a, 120b may be positioned between the component-embedded substrate 130 and the other of the first or second semiconductor chips 120a, 120b. The component-embedded substrate 130 may include a plurality of passive components 132a, 132b, 132c, 132d, 132e, 132f, and 132g embedded therein. The fan-out semiconductor package 100A may also include an encapsulant 140 encapsulating at least portions of the first connection member 110, the first semiconductor chip 120a, the second semiconductor chip 120b, and the component-embedded substrate 130. A second connection member 150 of the fan-out semiconductor package 100A may be disposed on the first connection member 110, an active surface of the first semiconductor chip 120a, an active surface of the second semiconductor chip 120b, and the component-embedded substrate 130.

The first connection member 110 may include redistribution layers 112a and 112b electrically connected to respective connection pads 122a and 122b of the first semiconductor chip 120a and the second semiconductor chip 120b. The second connection member 150 may include redistribution layers 152 electrically connected to the respective connection pads 122a and 122b of the first semiconductor chip 120a and the second semiconductor chip 120b. The plurality of passive components 132a, 132b, 132c, 132d, 132e, 132f, and 132g embedded in the component-embedded substrate 130 may be electrically connected to the respective connection pads 122a and 122b of the first semiconductor chip 120a and the second semiconductor chip 120b through the redistribution layers 152 of the second connection member 150, respectively. A passivation layer 160 may be disposed on the second connection member 150, an under-bump metal layer 170 may further be disposed in openings of the passivation layer 160, and connection terminals 180 such as solder balls, or the like, may be disposed on the under-bump metal layer 170. However, in other embodiments, one or more of the passivation layer 160, under-bump metal layer 170, and connection terminals 180 may be omitted.

In general, semiconductor packages and passive components are mounted on a main board or a sub-board of devices such as mobile devices, and the like. Therefore, there is a limitation in narrowing an interval between the components on the board, and particularly, several hundreds of small components are mounted on one board, and mounting costs and a defect rate may be relatively higher. In order to solve such a problem, a system in package (SIP) structure capable of reducing a mounting area and improving surface mounting technology (SMT) efficiency by implementing semiconductor chips and the passive components in one package may be considered. However, in the SIP structure, an interposer substrate is generally used, and thus, there is a limitation in reducing a thickness (e.g., a vertical thickness) of the package. Particularly, a plurality of passive components may have different thicknesses, and a thickness difference between the plurality of passive components and the semiconductor chips may be relatively higher. Therefore, when the plurality of passive components and the semiconductor chips are mounted on the interposer substrate, problems such as molding defects due to the thickness difference, and the like, may occur.

On the other hand, in the fan-out semiconductor package 100A according to the exemplary embodiment, the plurality of passive components 132a, 132b, 132c, 132d, 132e, 132f, and 132g may be packaged in the component-embedded substrate 130, and the component-embedded substrate 130 may be disposed between the semiconductor chips 120a and 120b and may be packaged further. In addition, instead of using an interposer substrate, the second connection member 150 including the redistribution layers 152 that may redistribute the connection pads 122a and 122b to a fan-out region may be formed (e.g., directly) on the active surfaces of the semiconductor chips 120a and 120b. Therefore, a thickness of the fan-out semiconductor package 100A may be reduced, and the plurality of passive components 132a, 132b, 132c, 132d, 132e, 132f, and 132g having different thicknesses may be used in the component-embedded substrate 130, and thereby mitigate the problems due to the thickness difference.

Particularly, in the fan-out semiconductor package 100A according to the exemplary embodiment, the component-embedded substrate 130 may include a substrate 131 having cavities 131Ha and 131Hb (FIG. 10), and the plurality of passive components 132a, 132b, 132c, 132d, 132e, 132f, and 132g may be disposed in the cavities 131Ha and 131Hb of the substrate 131 and be encapsulated by a resin layer 133. A thickness difference occurring due to the presence of the resin layer 133 may be minimized by introducing the substrate 131, which may also maintain the fan-out semiconductor package 100A rigid. Here, the passive components having relatively different thicknesses may be divided and disposed in a first cavity 131Ha and a second cavity 131Hb. In this case, a defect occurring due to the thickness difference may be minimized. In addition, the component-embedded substrate 130 may include a wiring member 134 including a wiring layer 134b connected to the redistribution layer 152 of the second connection member 150, and may be mounted in the fan-out semiconductor package 100A through the wiring member 134 as described above, such that electrical connection may be made with relative ease and reliability may be increased.

In the fan-out semiconductor package 100A according to the exemplary embodiment, the first connection member 110 may include the redistribution layers 112a and 112b that may redistribute the connection pads 122a and 122b. Therefore, a degree of freedom in a design may be increased, the number of layers of the second connection member 150 may be reduced, such that the fan-out semiconductor package 100A may be made more thinner, and defects that may occur when forming the second connection member 150 after the semiconductor chips 120a and 120b are disposed may be reduced. Due to the reduction in defects, yield may increase.

The respective components included in the fan-out semiconductor package 100A according to the exemplary embodiment will hereinafter be described in more detail.

The first connection member 110 may include the redistribution layers 112a and 112b for redistributing the connection pads 122a and 122b of the semiconductor chips 120a and 120b and thereby reduce the number of layers of the second connection member 150. The first connection member 110 may improve rigidity of the fan-out semiconductor package 100A depending on the materials included in the first connection member 110, and may keep a thickness of the encapsulant 140 uniform. The fan-out semiconductor package 100A according to the exemplary embodiment may be utilized as a package-on-package (POP) type package by the first connection member 110. The first connection member 110 may have the through-hole 110H. The semiconductor chips 120a and 120b and the component-embedded substrate 130 may be disposed adjacent each other in the through-hole 110H and may be spaced apart from the first connection member 110 by a predetermined distance. The semiconductor chips 120a and 120b and the component-embedded substrate 130 may be surrounded by the first connection member 110. In other words, the first connection member 110 may be located about the semiconductor chips 120a and 120b and the component-embedded substrate 130 along the periphery thereof. However, such a configuration is only an example and the placement of the semiconductor chips 120a and 120b, the component-embedded substrate 130, and the first connection member 110 may be modified as required by design and application.

As disclosed above, the first connection member 110 may include the redistribution layers 112a and 112b for redistributing the connection pads 122a and 122b of the semiconductor chips 120a and 120b to thus reduce the number of layers of the second connection member 150. The first connection member 110 may improve rigidity of the fan-out semiconductor package 100A depending on the materials included in the first connection member 110, and may keep a thickness of the encapsulant 140 uniform. The fan-out semiconductor package 100A according to the exemplary embodiment may be utilized as a package-on-package (POP) type package by the first connection member 110. The first connection member 110 may have the through-hole 110H. The semiconductor chips 120a and 120b may be disposed in the through-hole 110H and spaced apart from the first connection member 110 by a predetermined distance. The semiconductor chips 120a and 120b may be surrounded by the first connection member 110. In other words, the first connection member 110 may be located about the semiconductor chips 120a and 120b along the periphery thereof. However, such a configuration is only an example and the placement of the semiconductor chips 120a and 120b and the first connection member 110 may be modified as required by design and application.

The first connection member 110 may include an insulating layer 111, a first redistribution layer 112a in contact with the second connection member 150 and embedded in the insulating layer 111, and a second redistribution layer 112b disposed on a surface of the insulating layer 111 opposing a surface thereof having the first redistribution layer 112a embedded therein. The first and second redistribution layers 112a and 112b may be electrically connected to the connection pads 122a and 122b. The first and second redistribution layers 112a and 112b may be electrically connected to each other through vias 113 penetrating through the insulating layer 111.

When the first redistribution layer 112a is embedded in the insulating layer 111, a step formed due to a thickness of the first redistribution layer 112a may be reduced, and thus the first redistribution layer 112a may not project or protrude into the second connection member 150 and the thickness of the second connection member 150 may be relatively constant. That is, a difference between a distance from the redistribution layer 152 to a lower surface of the insulating layer 111 and a distance from the redistribution layer 152 to the connection pads 122a and 122b of the semiconductor chips 120a and 120b may be smaller than the thickness of the first redistribution layer 112a. Therefore, a high density wiring design of the second connection member 150 may be obtained. Thicknesses of the redistribution layers 112a and 112b of the first connection member 110 may be greater than those of the redistribution layers 152. Since the first connection member 110 may have a thickness equal to or greater than the thicknesses of the semiconductor chips 120a and 120b, the redistribution layers 112a and 112b may be formed having relatively larger sizes, depending on a scale of the first connection member 110. On the other hand, the redistribution layer 152 may be formed relatively thin.

A material included in the insulating layer 111 is not limited to any particular material. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The redistribution layers 112a and 112b may redistribute connection pads 122a and 122b of the semiconductor chips 112a and 120b. A material of each of the redistribution layers 120a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, control signals, a combination thereof, and the like. In addition, the redistribution layers 112a and 112b may include via pads, wire pads, connection terminal pads, and the like.

The vias 113 may electrically connect the redistribution layers 112a and 112b formed on different layers to each other, resulting in an electrical path in the first connection member 110. A material of each of the vias 113 may be a conductive material. Either each via 113 may completely fill the conductive material, or the conductive material may be formed along a wall of each via holes or in any other location in the via 113 to electrically connect the redistribution layers 112a and 112b. In addition, each of the vias 113 may have any desired shape, such as a cylindrical shape, a tapered shape, and the like, and is not limited to a particular shape. When holes for the vias 113 are formed, some of the pads of the first redistribution layer 112a may serve as a stopper, and one or more of the vias 113 may have a tapered shape having a width of an upper surface is larger than that of a lower surface. In this case, the vias 113 may be integrated with the pad patterns of the second redistribution layer 112b.

The semiconductor chips 120a and 120b may each be an integrated circuit (IC). The IC may be or include, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, a combination thereof, and the like, but is not limited thereto. For example, the IC may be a memory chip such as a volatile memory (for example, a DRAM), a non-volatile memory (for example, a ROM), a flash memory, or the like, or a logic chip such as an analog-to-digital converter, an application-specific IC (ASIC), or the like. Although two semiconductor chips are illustrated, the number of semiconductor chips is not limited thereto and a desired number of semiconductor chips (including a single semiconductor chip) may be mounted together with the component-embedded substrate in the fan-out semiconductor package 100A.

The semiconductor chips 120a and 120b may be ICs including an active wafer. In this case, a base material of each of bodies 121a and 121b of the semiconductor chips 120*a* and 120*b* may be silicon (Si), germanium (Ge), gallium arsenide (GaAs), or the like. Various circuits may be formed on each of the bodies 121*a* and 121*b*. The connection pads 122*a* and 122*b* may electrically connect the semiconductor chips 120*a* and 120*b* to other components, and a material of each of the connection pads 122*a* and 122*b* is not particularly limited as long as it is a conductive material such as aluminum (Al), or the like. Passivation layers 123*a* and 123*b* exposing the connection pads 122*a* and 122*b* may be formed on the bodies 121*a* and 121*b*, respectively, and may be oxide films, nitride films, a combination thereof, and the like, or double layers of oxide layers and nitride layers. Lower surfaces of the connection pads 122*a* and 122*b* may have a step with respect to a lower surface of the encapsulant 140 through the passivation layers 123*a* and 123*b*. Resultantly, bleeding of the encapsulant 140 into the lower surfaces of the connection pads 122*a* and 122*b* may be minimized. An insulating layer (not illustrated), and the like, may further be disposed in other required positions.

The component-embedded substrate 130 may include the substrate 131 having the first cavity 131Ha and the second cavity 131Hb, a plurality of passive components 132*a*, 132*b*, 132*e*, and 132*f* may be disposed in the first cavity 131Ha of the substrate 131, a plurality of passive components 132*c*, 132*d*, and 132*g* may be disposed in the second cavity 131Hb of the substrate 131, the resin layer 133 may surround at least portions of the plurality of passive components 132*a*, 132*b*, 132*c*, 132*d*, 132*e*, 132*f*, and 132*g*, and the wiring member 134 may include the wiring layer 134*b* disposed on the plurality of passive components 132*a*, 132*b*, 132*c*, 132*d*, 132*e*, 132*f*, and 132*g* and electrically connected to the plurality of passive components 132*a*, 132*b*, 132*c*, 132*d*, 132*e*, 132*f*, and 132*g*. An insulating layer 135 and/or a metal layer 136 may further be disposed on the resin layer 133.

The substrate 131 may be formed of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, a copper clad laminate (CCL), an unclad CCL, or the like. The cavities 131Ha and 131Hb formed in the substrate 131 may penetrate through the substrate 131.

The passive components 132*a*, 132*b*, 132*c*, 132*d*, 132*e*, 132*f*, and 132*g* may be multilayer ceramic capacitors (MLCCs), low inductance chip capacitors (LICCs), inductors, or the like, respectively. Here, the passive components 132*a*, 132*b*, 132*c*, 132*d*, 132*e*, 132*f*, and 132*g* may have different thicknesses. In this case, for example, the passive components 132*a*, 132*b*, 132*e*, and 132*f* having relatively reduced thicknesses may be disposed in the first cavity 131Ha, and the passive components 132*c*, 132*d*, and 132*g* having relatively great thicknesses may be disposed in the second cavity 131Hb and defects due to a difference in thickness may be minimized.

The resin layer 133 may protect the passive components 132*a*, 132*b*, 132*c*, 132*d*, 132*e*, 132*f*, and 132*g*. The resin layer 133 may surround at least portions of the passive components 132*a*, 132*b*, 132*c*, 132*d*, 132*e*, 132*f*, and 132*g*. The resin layer 133 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, a combination thereof, and the like. In addition, the known molding material such as an epoxy molding compound (EMC), or the like, may be used.

The wiring member 134 may include an insulating layer 134*a*, the wiring layer 134*b* formed on the insulating layer 134*a*, and vias 134*c* penetrating through the insulating layer 134*a* and connecting the passive components 132*a*, 132*b*, 132*c*, 132*d*, 132*e*, 132*f*, and 132*g* to the wiring layer 134*b*. The insulating layer 134*a* may include the known insulating material, for example, PID, ABF, or the like. The wiring layer 134*b* may be formed of a conductive material such as copper (Cu), or the like, and may include pad patterns for connecting the passive components 132*a*, 132*b*, 132*c*, 132*d*, 132*e*, 132*f*, and 132*g* to the redistribution layer 152 of the second connection member 150. The via 134*c* may also be formed of a conductive material such as copper (Cu), or the like, and a shape of the via 134*c* is not particularly limited.

The insulating layer 135 may protect the substrate 131, the resin layer 133, or the like. The insulating layer 135 may include insulating material, for example, PID, ABF, or the like. The metal layer 136 may be disposed on the insulating layer 135 to at least partially cover upper portions of the passive components 132*a*, 132*b*, 132*c*, 132*d*, 132*e*, 132*f*, and 132*g*. The metal layer 136 may include a metal such as copper (Cu), or the like, and the component-embedded substrate 130 may have an improved electromagnetic wave blocking function and/or heat dissipation function through the metal layer 136. In some cases, the metal layer 136 may be directly formed on the resin layer 133 and in such instances the insulating layer 135 is absent.

The encapsulant 140 may protect the first connection member 110, the semiconductor chips 120*a* and 120*b*, the component-embedded substrate 130, and the like. An encapsulation form of the encapsulant 140 is not particularly limited, but may be a form in which the encapsulant 140 at least partially surrounds at least portions of the first connection member 110, the first semiconductor chips 120*a* and 120*b*, the component-embedded substrate 130, and the like. For example, the encapsulant 140 may cover the first connection member 110, the component-embedded substrate 130, and the inactive surfaces of the semiconductor chips 120*a* and 120*b*, and fill spaces between walls of the through-hole 110H and the side surfaces of the semiconductor chips 120*a* and 120*b* and the component-embedded substrate 130. In addition, the encapsulant 140 may also fill at least portions of spaces between the passivation layers 123*a* and 123*b* of the semiconductor chips 120*a* and 120*b* and the second connection member 150. The encapsulant 140 may fill the through-hole 110H to thus serve as an adhesive for the semiconductor chips 120*a* and 120*b* and the component-embedded substrate 130 and reduce buckling of the semiconductor chips 120*a* and 120*b* and the component-embedded substrate 130.

The encapsulant 140 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, a combination thereof, and the like. In addition, the known molding material such as an epoxy molding compound (EMC), or the like, may also be used. Alternatively, a material in which an insulating resin such as a thermosetting resin or a thermoplastic resin is impregnated with an inorganic filler and/or a core material such as a glass fiber (or a glass cloth or a glass fabric) may also be used as the insulating material.

When a material including a glass fiber, an inorganic filler, and an insulating resin is used as the material of the encapsulant 140, warpage of the fan-out semiconductor package 100A may be minimized without performing an additional process. In detail, the encapsulant 140 may include the glass fiber to maintain rigidity of the fan-out semiconductor package 100A. In addition, the encapsulant 140 may include the inorganic filler, and a coefficient of thermal expansion (CTE) may thus be adjusted. Therefore, occurrence of the warpage of the fan-out semiconductor package 100A due to mismatch between CTEs may be minimized. Meanwhile, the encapsulant 140 may encapsulate the first connection member 110, the component-embedded substrate 130, and the semiconductor chips 120a and 120b in a b-stage. Therefore, the insulating resin and the inorganic filler of the encapsulant 140 may not only be disposed on the first connection member 110, the component-embedded substrate 130, and the inactive surfaces of the semiconductor chips 120a and 120b, but also be disposed in the spaces between the walls of the through-hole 110H and the side surfaces of the semiconductor chips 120a and 120b and the component-embedded substrate 130. On the other hand, the glass fiber of the encapsulant 140 may be disposed on only the first connection member 110, the component-embedded substrate 130, and the inactive surfaces of the semiconductor chips 120a and 120b. Rigidity of the fan-out semiconductor package 100A at an upper portion of the fan-out semiconductor package 100A may be maintained by disposing the glass fiber in such a form.

The second connection member 150 may redistribute the connection pads 122a and 122b of the semiconductor chips 120a and 120b. Several tens to several hundreds of connection pads 122a and 122b of the semiconductor chips 120a and 120b having various functions may be redistributed by the second connection member 150, and may be physically or electrically connected to one or more external sources through the connection terminals 180 depending on the functions. The second connection member 150 may include insulating layers 151, the redistribution layers 152 disposed on the insulating layers 151, and vias 153 penetrating through the insulating layers 151 and connecting the redistribution layers 152 to each other. The second connection member 150 may be formed of a single layer, or may be formed of a plurality of layers of which the number is greater than that illustrated in the drawings.

A material of each of the insulating layers 151 may be an insulating material. In this case, a photosensitive insulating material such as a PID resin may also be used as the insulating material. That is, the insulating layer 151 may be a photosensitive insulating layer. When the insulating layer 151 has photosensitive properties, the insulating layer 151 may be formed to have a smaller thickness, and a fine pitch of the via 153 may be achieved more easily. The insulating layer 151 may be a photosensitive insulating layer including an insulating resin and an inorganic filler. When the insulating layers 151 are multiple layers, materials of the insulating layers 151 may be the same as each other, and may also be different from each other, if necessary. When the insulating layers 151 are the multiple layers, the insulating layers 151 may be integrated with each other depending on a process, such that a boundary therebetween may also not be apparent.

The redistribution layers 152 may redistribute the connection pads 122a and 122b, and a material of each of the redistribution layers 152 may be a conductive material such as copper (Cu), aluminum (Al), silver (Ag), tin (Sn), gold (Au), nickel (Ni), lead (Pb), titanium (Ti), alloys thereof, and the like. The redistribution layers 152 may perform various functions depending on designs of their corresponding layers. For example, the redistribution layers 152 may include ground (GND) patterns, power (PWR) patterns, signal (S) patterns, and the like. Here, the signal (S) patterns may include various signals except for the ground (GND) patterns, the power (PWR) patterns, and the like, such as data signals, control signals, and the like. In addition, the redistribution layers 152 may include via pads, connection terminal pads, and the like.

The vias 153 may electrically connect the redistribution layers 152, the wiring layers 134b, the connection pads 122a and 122b, or the like, formed on different layers to each other, resulting in an electrical path in the fan-out semiconductor package 100A. A material of each of the vias 153 may be a conductive material such as copper (Cu), aluminum (Al), silver (Ag), tin (Sn), gold (Au), nickel (Ni), lead (Pb), titanium (Ti), alloys thereof, and the like. Each of the vias 153 may be completely filled with the conductive material, or the conductive material may also be formed along a wall of each of the vias 153 or at any location in the via 153 as long as electrical conductively is maintained across the via. In addition, each of the vias 153 may have a desired shape, such as a tapered shape, a cylindrical shape, and the like.

The passivation layer 160 may protect the second connection member 150 from external physical or chemical damage. The passivation layer 160 may have openings exposing at least portions of the redistribution layer 152 of the second connection member 150. A plurality (e.g., several tens to several thousands) of openings may be formed in the passivation layer 160. The passivation layer 160 may include an insulating resin and an inorganic filler, but may not include a glass fiber. For example, the passivation layer 160 may be formed of ABF, but is not limited thereto.

The under-bump metal layer 170 may improve connection reliability of the connection terminals 180 to improve board level reliability of the fan-out semiconductor package 100A. The under-bump metal layer 170 may be connected to the redistribution layer 152 of the second connection member 150 exposed through the openings of the passivation layer 160. The under-bump metal layer 170 may be formed in the openings of the passivation layer 160 by a desired metallization method using conductive material such as a metal or other desired conductive materials.

The connection terminals 180 may be additionally configured to physically and/or electrically connect the fan-out semiconductor package 100A to other external components. For example, the fan-out semiconductor package 100A may be mounted on the main board of the electronic device through the connection terminals 180. Each of the connection terminals 180 may be formed of a conductive material, for example, a solder, or the like. However, this is only an example, and a material of each of the connection terminals 180 is not particularly limited thereto. Each of the connection terminals 180 may be a land, a ball, a pin, or the like. The connection terminals 180 may be formed as a multilayer or single layer structure. When the connection terminals 180 are formed as a multilayer structure, the connection terminals 180 may include a copper (Cu) pillar and a solder. When the connection terminals 180 are formed as a single layer structure, the connection terminals 180 may include a tin-silver solder or copper (Cu). However, this is only an example, and the connection terminals 180 are not limited thereto.

The number, an interval, a disposition, or the like, of the connection terminals 180 is not particularly limited, and may be sufficiently modified depending on design and application requirements. For example, the number of connection terminals 180 may be according to the numbers of connection pads 122a and 122b. When the connection terminals 180 are solder balls, the connection terminals 180 may cover side surfaces of the underbump metal layer 170 extending onto one surface of the passivation layer 160, and connection reliability may be more excellent.

At least one of the connection terminals 180 may be disposed in a fan-out region. The fan-out region is a region except for the region in which the semiconductor chips 120a and 120b are disposed. The fan-out package may have excellent reliability as compared to a fan-in package, may implement a plurality of input/output (I/O) terminals, and may facilitate a 3D interconnection. In addition, compared to a ball grid array (BGA) package, a land grid array (LGA) package, or the like, the fan-out package may have a reduced thickness and costs.

Meanwhile, although not illustrated in FIGS. 9 and 10, a metal thin film may be formed on the walls of the through-hole 110H of the first connection member 110, in order to dissipate heat and/or block electromagnetic waves. Similarly, a metal thin film may be formed on walls of the cavities 131Ha and 131Hb of the substrate 131 of the component-embedded substrate 130 in order to dissipate heat and/or block electromagnetic waves.

Figure 11A:
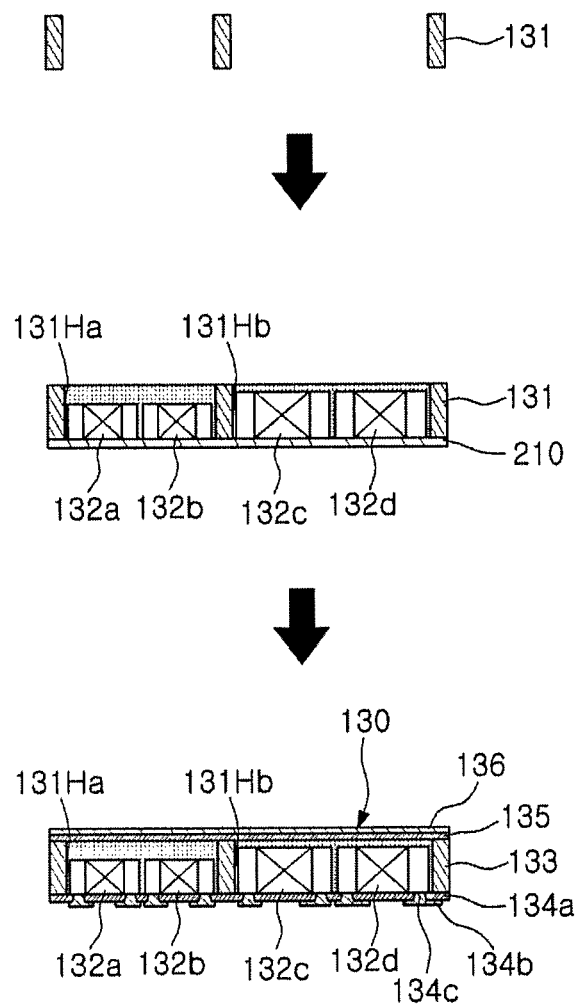
FIGS. 11A and 11B are schematic views of an example of process of manufacturing the fan-out semiconductor package of FIG. 9.
Figure 11B:
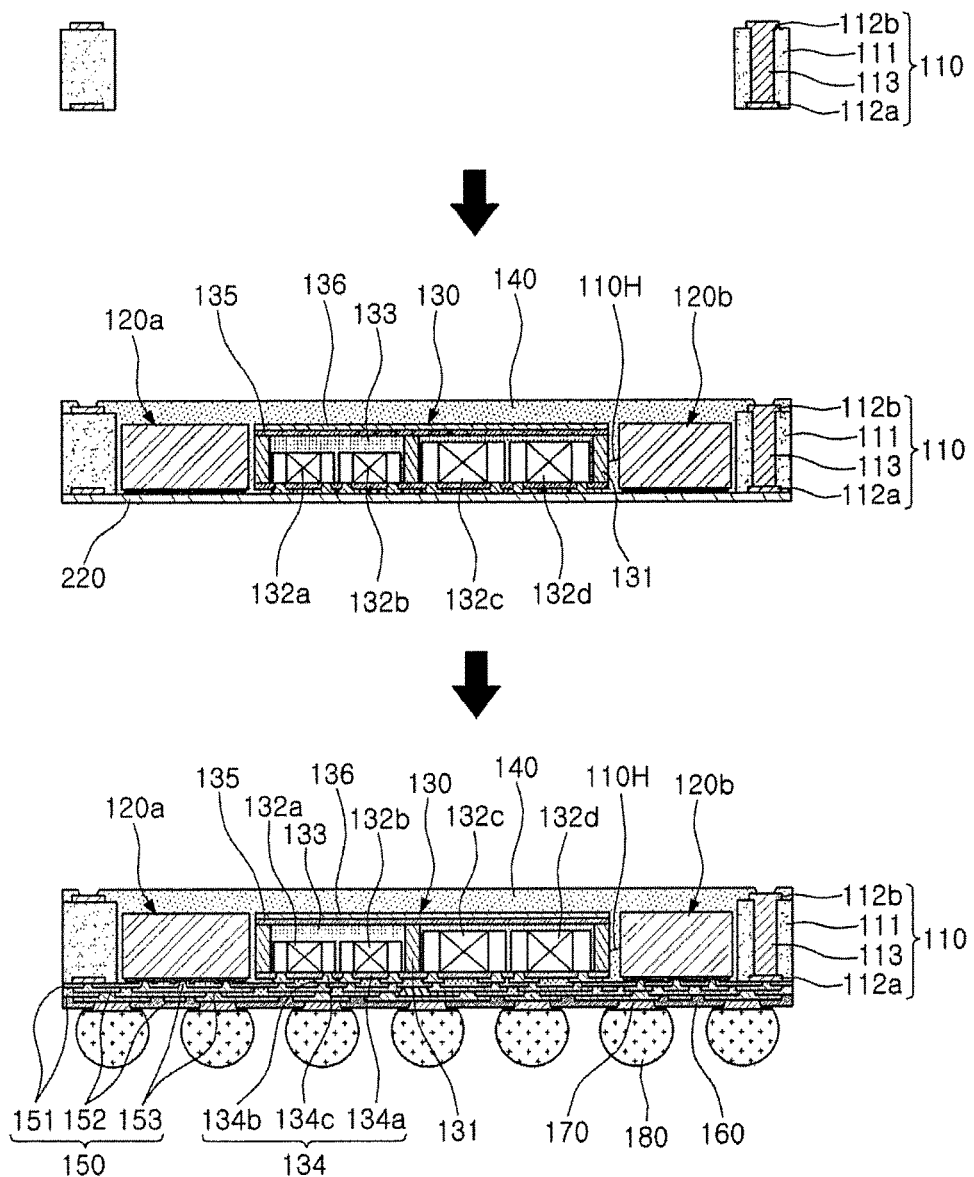

FIGS. 11A and 11B are schematic views illustrating an example process of manufacturing the fan-out semiconductor package 100A of FIG. 9.

Referring to FIG. 11A, the component-embedded substrate 130 may be prepared. The component-embedded substrate 130 may be prepared by forming the cavities 131Ha and 131Hb in the substrate 131 using a laser drill, a mechanical drill, a combination thereof, and the like, disposing the passive components 132a, 132b, 132c, 132d, 132e, 132f, and 132g in the cavities 131Ha and 131Hb using an adhesive film 210, or the like, forming the resin layer 133 using lamination method or applying method, and then forming the wiring member 134. The wiring member 134 may be formed by forming the insulating layer 134a using lamination method or applying method, forming holes for the vias 134c using a photolithography method, a laser drill, a mechanical drill, a combination thereof, and the like, and forming the wiring layer 134b and the vias 134c using a plating method such electroplating, electroless plating, a combination thereof, and the like. The insulating layer 135 may be formed using lamination method or applying method, and the metal layer 136 may be formed by sputtering, plating, a combination thereof, and the like.

Referring to FIG. 11B, the first connection member 110 having the through-hole 110H may be prepared. The first connection member 110 may be formed by forming the first redistribution layer 112a on a carrier film, forming the insulating layer 111 covering the first redistribution layer 112a, forming the vias 113 and the second redistribution layer 112b, and then separating the manufactured first connection member 110 from the carrier film. Alternatively, the first connection member 110 may be formed by preparing the insulating layer 111, forming holes for the vias 113 in the insulating layer 111, and forming the vias 113 in the insulating layer 111 and forming the redistribution layers 112a and 112b, respectively, on and beneath the insulating layer 111 by plating, or the like. Then, the semiconductor chips 120a and 120b and the component-embedded substrate 130 may be disposed adjacent each other in the through-hole 110H of the first connection member 110 using an adhesive film 220, or the like, and the encapsulant 140 may be formed using lamination method or applying method to encapsulate the semiconductor chips 120a and 120b and the component-embedded substrate 130. Then, the second connection member 150 may be formed. The second connection member 150 may be formed by forming the insulating layer 151 using lamination method or applying method, forming holes for the vias 153 using a photolithography method, a laser drill, a mechanical drill, a combination thereof, and the like, and forming the redistribution layer 152 and the vias 153 by the known plating method such electroplating, electroless plating, a combination thereof, and the like. The passivation layer 160 may be formed using lamination method or applying method, the underbump metal layer 170 may be formed by a metallization method, and the connection terminals 180 may be then be formed. Accordingly, the fan-out semiconductor package 100A according to the exemplary embodiment may be manufactured through a series of processes.

Figure 12:
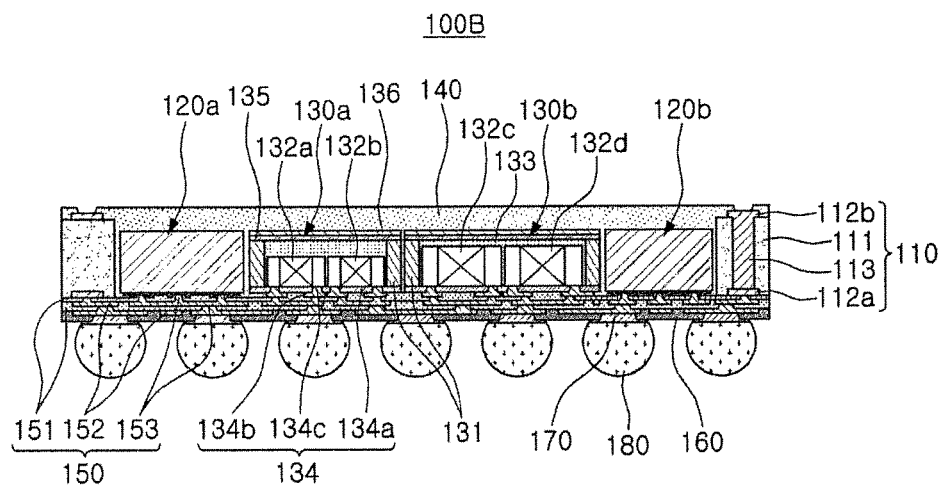
FIG. 12 is a schematic cross-sectional view of another example fan-out semiconductor package.

FIG. 12 is a schematic cross-sectional view of another example of a fan-out semiconductor package 100B.

Referring to FIG. 12, the fan-out semiconductor package 100B may include a first component-embedded substrate 130a and a second component-embedded substrate 130b. The first component-embedded substrate 130a and the second component-embedded substrate 130b may be disposed adjacent to and spaced apart from each other by a predetermined distance, and may include a plurality of passive components 132a and 132b, 132c and 132d embedded therein, respectively. The passive components 132a, 132b, 132c, and 132d may be MLCCs, LICCs, inductors, or the like, respectively, and may have different thicknesses (e.g., vertical thickness). In this case, for example, the passive components 132a and 132b having relatively reduced thicknesses may be embedded in the first component-embedded substrate 130a, and the passive components 132c and 132d having relatively greater thicknesses may be embedded in the second component-embedded substrate 130b and a defect that may occur due to a thickness difference may be minimized. The first and second component-embedded substrate 130a and 130b may include substrates 131, the passive components 132a and 132b, 132c and 132d, resin layers 133, wiring members 134, insulating layers 135, metal layers 136, and the like, respectively, similar to the first and second component-embedded substrate 130a and 130b described above, and the description thereof is omitted herein for the sake of brevity.

The descriptions of different configurations and manufacturing methods of the semiconductor package 100B are similar those described above with reference to the fan-out semiconductor package 100A, and are thus omitted herein for the sake of brevity.

Figure 13:
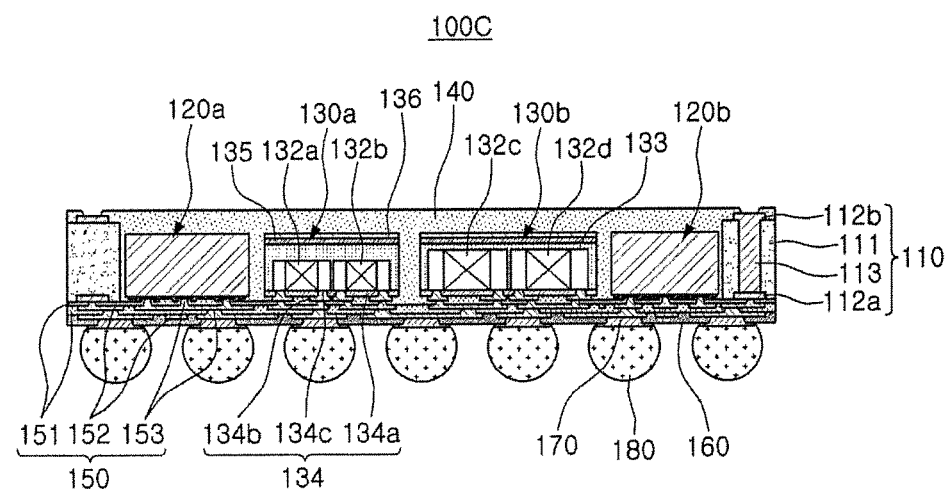
FIG. 13 is a schematic cross-sectional view of another example fan-out semiconductor package.

FIG. 13 is a schematic cross-sectional view of another example fan-out semiconductor package 100C.

Referring to FIG. 100C, the fan-out semiconductor package 100C may include a first component-embedded substrate 130a and a second component-embedded substrate 130b. However, the first component-embedded substrate 130a and the second component-embedded substrate 130b may not include substrates 131. For example, the substrates 131 may be removed by sawing, or the like, during manufacturing the component-embedded substrates 130a and 130b.

The descriptions of different configurations and manufacturing methods of the semiconductor package 100C are similar to those described above with reference to the fan-out semiconductor packages 100A and 100B, and are omitted herein for the sake of brevity.

Figure 14:
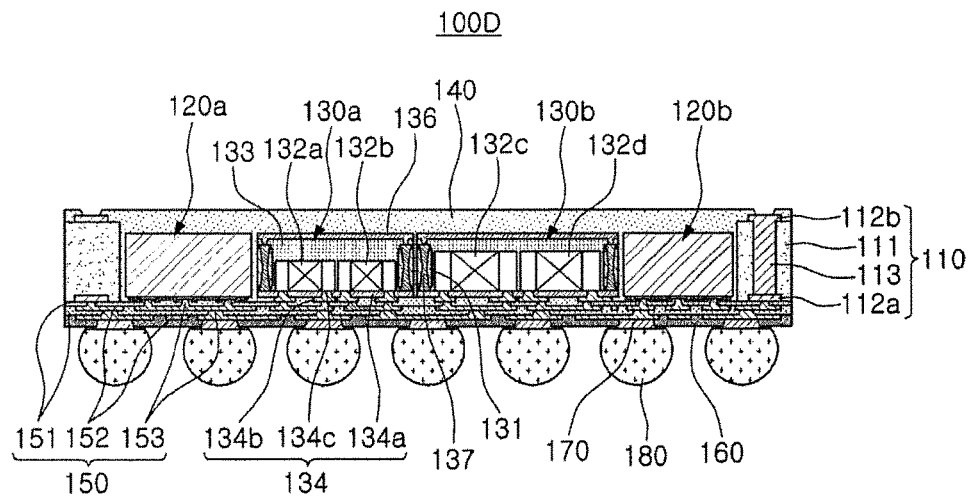
FIG. 14 is a schematic cross-sectional view of another example fan-out semiconductor package.

FIG. 14 is a schematic cross-sectional view of another example fan-out semiconductor package 100D.

Referring to FIG. 100D, the fan-out semiconductor package 100D may include a first component-embedded substrate 130a and a second component-embedded substrate 130b. The first and second component-embedded substrates 130a and 130b may further include a plurality of vias 137 penetrating through the substrates 131, respectively. The plurality of vias 137 may be disposed to be spaced apart from each other by a predetermined distance to surround a plurality of passive components 132a and 132b, 132c and 132d, respectively. The plurality of vias 137 may be connected to a metal layer 136 covering upper portions of the plurality of passive components 132a and 132b, 132c and 132d, and electromagnetic waves propagating between the plurality of passive components 132a and 132b, 132c and 132d and/or between the plurality of passive components 132a and 132b, 132c and 132d and semiconductor chips 120a and 120b may be attenuated. In addition, a heat dissipation effect may be improved. The plurality of vias 137 may be dummy vias connected to a ground (GND) pattern. In this case, the plurality of vias 137 may be insulated from signal patterns, and the like.

The descriptions of different configurations and manufacturing methods of the semiconductor package 100D are similar to those described above with reference to the fan-out semiconductor packages 100A, 100B, and 100C, and are omitted herein for the sake of brevity. In an embodiment, the electromagnetic wave blocking structure in the semiconductor package 100D may also be used in the fan-out semiconductor package 100A having a single component-embedded substrate 130, without departing from the scope of the disclosure.

Figure 15:
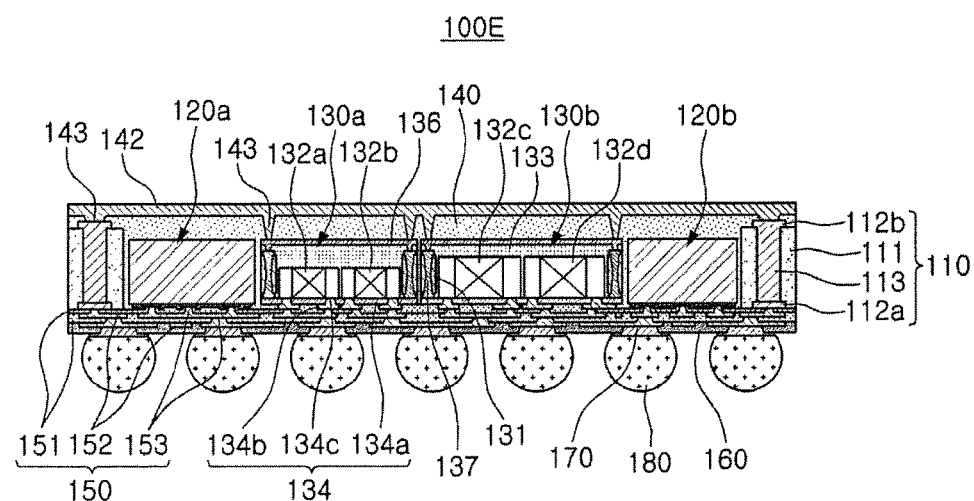
FIG. 15 is a schematic cross-sectional view of another example fan-out semiconductor package.

FIG. 15 is a schematic cross-sectional view of another fan-out semiconductor package 100E.

Referring to FIG. 15, the fan-out semiconductor package 100E may include a first component-embedded substrate 130a and a second component-embedded substrate 130b. The first and second component-embedded substrates 130a and 130b may further include a plurality of vias 137 penetrating through substrates 131 and connected to a metal layer 136, respectively. In addition, a first connection member 110 may include a plurality of vias 113 penetrating through an insulating layer 111 and surrounding the semiconductor chips 120a and 120b and the component-embedded substrates 130a and 130b. The plurality of vias 113 may be connected to a metal layer 142 disposed on the encapsulant 140 and covering semiconductor chips 120a and 120b and the component-embedded substrates 130a and 130b, through vias 143. That is, an electromagnetic wave blocking structure discussed above with reference to FIG. 14 may be used in the entire fan-out semiconductor package 100E. As a result, electromagnetic wave blocking and heat dissipation in the semiconductor package 100E may be improved. The plurality of vias 113 may be dummy vias connected to a ground (GND) pattern. In this case, the plurality of vias 113 may be insulated from signal patterns, and the like. In some embodiments, the plurality of vias 113 may include both of dummy vias and signal vias. In this case, the dummy vias may be disposed to surround the signal vias or be disposed to be surrounded by the signal vias.

The descriptions of different configurations and manufacturing methods of the semiconductor package 100E are similar to those described above with reference to the fan-out semiconductor packages 100A, 100B, 100C, and 100D, and are omitted herein for the sake of brevity. In an embodiment, the electromagnetic wave blocking structure in the semiconductor package 100E may also be used in the fan-out semiconductor package 100A having a single component-embedded substrate 130, without departing from the scope of the disclosure.

Figure 16:
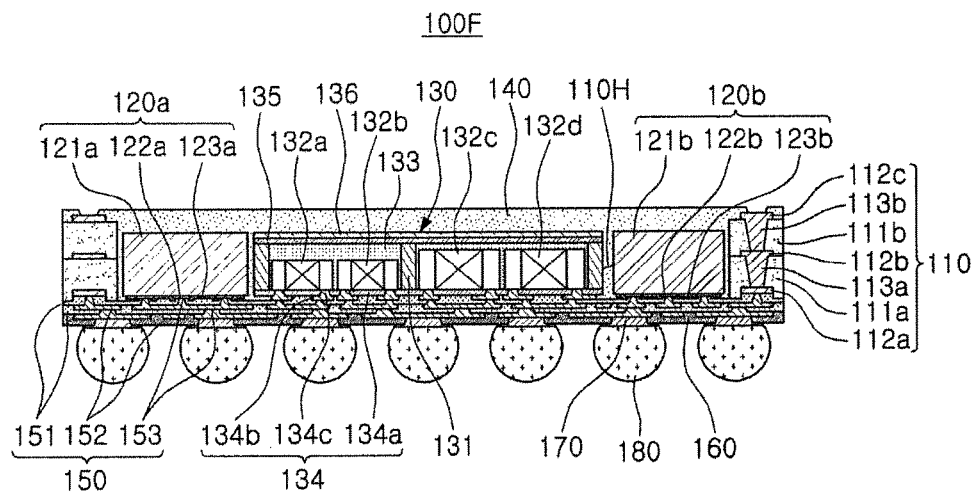
FIG. 16 is a schematic cross-sectional view of another example fan-out semiconductor package.

FIG. 16 is a schematic cross-sectional view of another fan-out semiconductor package 100F.

Referring to FIG. 16, in the fan-out semiconductor package 100F, a first connection member 110 may include a first insulating layer 111a in contact with a second connection member 150, a first redistribution layer 112a in contact with the second connection member 150 and embedded in the first insulating layer 111a, a second redistribution layer 112b disposed on a surface of the first insulating layer 111a opposite a surface of the first insulating layer 111a having the first redistribution layer 112a embedded therein, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122a and 122b. The first and second redistribution layers 112a and 112b and the second and third redistribution layers 112b and 112c may be electrically connected to each other through first and second vias 113a and 113b penetrating through the first and second insulating layers 111a and 111b, respectively.

When the first redistribution layer 112a is embedded in the first insulating layer 111a, a step profile generated due to a thickness of the first redistribution layer 112a may be minimized, and the first redistribution layer 112a may not project or protrude into the second connection member 150 and the thickness of the second connection member 150 may be relatively constant. Stated otherwise, a difference between a distance from a redistribution layer 152 of the second connection member 150 to a lower surface of the first insulating layer 111a and a distance from the redistribution layer 152 of the second connection member 150 to the connection pads 122a and 122b of semiconductor chips 120a and 120b may be smaller than the thickness of the first redistribution layer 112a. Therefore, a high density wiring design of the second connection member 150 may be easy.

A lower surface of the first redistribution layer 112a of the first connection member 110 may be disposed on a level above a lower surface of the connection pads 122a and 122b of the semiconductor chips 120a and 120b. In addition, a distance between the redistribution layer 152 of the second connection member 150 and the first redistribution layer 112a of the first connection member 110 may be greater than that between the redistribution layer 152 of the second connection member 150 and the connection pads 122a and 122b of the semiconductor chips 120a and 120b. This may be because the first redistribution layer 112a may be recessed into the first insulating layer 111a. As described above, when the first redistribution layer 112a is recessed in the first insulating layer 111a, such that the lower surface of the first insulating layer 111a and the lower surface of the first redistribution layer 112a have a step therebetween, bleeding of a material of the encapsulant 140 into the first redistribution layer 112a may be minimized and thus the contamination of the first redistribution layer 112a may be minimized. The second redistribution layer 112b of the first connection member 110 may be disposed on a level between active surfaces and inactive surfaces of the semiconductor chips 120a and 120b. The first connection member 110 may be formed to have a thickness corresponding to those of the semiconductor chips 120a and 120b. Therefore, the second redistribution layer 112b formed in the first connection member 110 may be disposed on a level between the active surfaces and the inactive surfaces of the semiconductor chips 120a and 120b.

Thicknesses of the redistribution layers 112a, 112b, and 112c of the first connection member 110 may be greater than that of the redistribution layers 152 of the second connection member 150. Since the first connection member 110 may have a thickness equal to or greater than those of the semiconductor chips 120a and 120b, the redistribution layers 112a, 112b, and 112c may be formed to have large sizes, depending on a scale of the first connection member 110. On the other hand, the redistribution layers 152 of the second connection member 150 may be formed at relatively small sizes for thinness.

The descriptions of different configurations and manufacturing methods of the semiconductor package 100F are similar to those described above with reference to the fan-out semiconductor packages 100A, 100B, 100C, 100D, and 100E, and are omitted herein for the sake of brevity. In an embodiment, the features and configurations of the fan-out semiconductor packages 100B, 100C, 100D, and 100E may also be used in the fan-out semiconductor package 100F, without departing from the scope of the disclosure.

Figure 17:
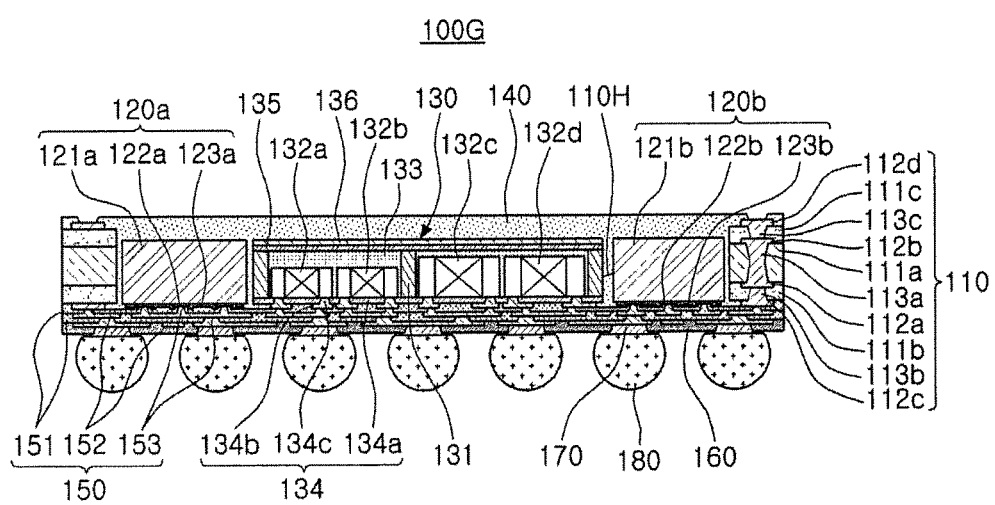
FIG. 17 is a schematic cross-sectional view of another example fan-out semiconductor package.

FIG. 17 is a schematic cross-sectional view of another example of a fan-out semiconductor package 100G.

Referring to FIG. 17, in the fan-out semiconductor package 100G, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122a and 122b. Since the first connection member 110 may include a larger number of redistribution layers 112a, 112b, 112c, and 112d, a structure of the second connection member 150 may further be simplified. Therefore, a decrease in yields due to defects occurring when forming the second connection member 150 may be minimized. Meanwhile, the first to fourth redistribution layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than the thicknesses of the second insulating layer 111b and the third insulating layer 111c. The first insulating layer 111a may be relatively thick in order to maintain rigidity, and the second insulating layer 111b and the third insulating layer 111c may be used so that an increased number of redistribution layers 112c and 112d may be formed. The first insulating layer 111a may include an insulating material different from those of the second insulating layer 111b and the third insulating layer 111c. For example, the first insulating layer 111a may be, for example, prepreg including a glass fiber, an inorganic filler, and an insulating resin, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first vias 113a penetrating through the first insulating layer 111a may have a diameter greater than the diameters of second vias 113b and third vias 113c penetrating through the second insulating layer 111b and the third insulating layer 111c.

A lower surface of the third redistribution layer 112c of the first connection member 110 may be disposed on a level below a lower surface of the connection pads 122a and 122b of semiconductor chips 120a and 120b. In addition, a distance between a redistribution layer 152 of the second connection member 150 and the third redistribution layer 112c of the first connection member 110 may be smaller than that between the redistribution layer 152 of the second connection member 150 and the connection pads 122a and 122b of the semiconductor chips 120a and 120b. This may be because the third redistribution layer 112c may protrude from the second insulating layer 111b, resulting in contacting the second connection member 150. The first redistribution layer 112a and the second redistribution layer 112b of the first connection member 110 may be disposed on a level between active surfaces and inactive surfaces of the semiconductor chips 120a and 120b. The first connection member 110 may be formed to have a thickness corresponding to the thicknesses of the semiconductor chips 120a and 120b. Therefore, the first redistribution layer 112a and the second redistribution layer 112b formed in the first connection member 110 may be disposed on a level between the active surfaces and the inactive surfaces of the semiconductor chips 120a and 120b.

Thicknesses of the redistribution layers 112a, 112b, 112c, and 112d of the first connection member 110 may be greater those that of the redistribution layers 152 of the second connection member 150. Since the first connection member 110 may have a thickness equal to or greater than those of the semiconductor chips 120a and 120b, the redistribution layers 112a, 112b, 112c, and 112d may also be formed to have large sizes. On the other hand, the redistribution layers 152 of the second connection member 150 may be formed having relatively reduced thicknesses.

The descriptions of different configurations and manufacturing methods of the semiconductor package 100G are similar to those described above with reference to the fan-out semiconductor packages 100A, 100B, 100C, 100D, 100E, and 100F, and are omitted herein for the sake of brevity. In an embodiment, the features and configurations of the fan-out semiconductor packages 100B, 100C, 100D, and 100E may also be used in the fan-out semiconductor package 100G, without departing from the scope of the disclosure.

As set forth above, according to the exemplary embodiments in the present disclosure, a fan-out semiconductor package in which a plurality of passive components may be mounted together with a semiconductor chip, a size and a thickness of the package may be reduced, even though an increased number of passive components mounted together with the semiconductor chip. Further, manufacturing costs and a defect rate may be reduced.

While exemplary embodiments have been shown and described above, it will be apparent to those skilled in the art that modifications and variations could be made without departing from the scope of the present invention as defined by the appended claims.

What is claimed is:
1. A fan-out semiconductor package, comprising:
a first connection member having a through-hole;
a semiconductor chip disposed in the through-hole of the first connection member and having an active surface including connection pads disposed thereon and an inactive surface opposite the active surface;
a first component-embedded substrate disposed in the through-hole of the first connection member and spaced apart from the semiconductor chip, and including a first resin layer and a first passive component at least partially embedded in the first resin layer;
an encapsulant encapsulating portions of the first connection member, the first component-embedded substrate, and the semiconductor chip, the encapsulant being spaced-apart from the first passive component at least by the first resin layer; and
a second connection member disposed on the first connection member, the first component-embedded substrate, and the active surface of the semiconductor chip,
wherein the first connection member and the second connection member include, respectively, redistribution layers electrically connected to the connection pads of the semiconductor chip, and
the first passive component is electrically connected to the connection pads of the semiconductor chip through the redistribution layer of the second connection member.

2. The fan-out semiconductor package of claim 1, wherein the first component-embedded substrate further includes a wiring member including a wiring layer disposed on the first passive component and electrically connected to the first passive component.

3. The fan-out semiconductor package of claim 2, wherein the first component-embedded substrate further includes a substrate having a first cavity defined therein,
the first passive component is disposed in the first cavity, and
the first passive component and the encapsulant are spaced-apart from each other also by the substrate.

4. The fan-out semiconductor package of claim 3, wherein the substrate further includes a second cavity spaced apart from each other from the first cavity,
each of a plurality of passive components including the first passive component disposed in the first cavity has a thickness smaller than a thickness of each of a plurality of passive components disposed in the second cavity.

5. The fan-out semiconductor package of claim 3, wherein the first component-embedded substrate further includes a first metal layer disposed on the first resin layer, and
the encapsulant and the first passive component are spaced apart from each other also by the first metal layer.

6. The fan-out semiconductor package of claim 5, further comprising:
a plurality of disposed in the first connection member; and
a second metal layer disposed on the encapsulant, and
wherein the second metal layer is electrically connected to the first metal layer and the plurality of vias.

7. The fan-out semiconductor package of claim 1, further comprising a second component-embedded substrate disposed in the through-hole of the first connection member and spaced apart from the first component-embedded substrate, and including a second resin layer and a plurality of passive components at least partially embedded in the second resin layer, the encapsulant being spaced-apart from the plurality of passive component of the second component-embedded substrate at least by second resin layer,
each of a plurality of passive components including the first passive component disposed in the first component-embedded substrate has a thickness smaller than a thickness of each of the plurality of passive components disposed in the second component-embedded substrate.

8. The fan-out semiconductor package of claim 7, wherein the first and second component-embedded substrates further include wiring members including wiring layers disposed on the plurality of passive components and electrically connected to the plurality of passive components, respectively.

9. The fan-out semiconductor package of claim 8, wherein the first and second component-embedded substrates each include substrates having cavities, and
the plurality of passive components respectively embedded in first and second component-embedded substrates are disposed in the cavities of the substrates of the first and second component-embedded substrates, respectively.

10. The fan-out semiconductor package of claim 9, wherein the first and second component-embedded substrates further include first metal layers disposed on the first and second resin layers, respectively, and
the encapsulant and the plurality of passive components of the first and second component-embedded substrates are spaced apart from each other also by the first metal layers, respectively.

11. The fan-out semiconductor package of claim 10, further comprising:
a plurality of vias disposed in the first connection member; and
a second metal layer disposed on the encapsulant, and
wherein the second metal layer is connected to the first metal layers and the plurality of vias.

12. The fan-out semiconductor package of claim 1, wherein the first connection member includes a first insulating layer, a first redistribution layer in contact with the second connection member and embedded in the first insulating layer, and a second redistribution layer disposed on the other surface of the first insulating layer opposing one surface of the first insulating layer in which the first redistribution layer is embedded.

13. The fan-out semiconductor package of claim 12, wherein the first connection member further includes a second insulating layer disposed on the first insulating layer and covering the second redistribution layer and a third redistribution layer disposed on the second insulating layer.

14. The fan-out semiconductor package of claim 12, wherein a distance between the redistribution layer of the second connection member and the first redistribution layer is greater than a distance between the redistribution layer of the second connection member and the connection pad of the semiconductor chip.

15. The fan-out semiconductor package of claim 1, wherein the first connection member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer.

16. The fan-out semiconductor package of claim 15, wherein the first connection member further includes a third insulating layer disposed on the first insulating layer and covering the second redistribution layer and a fourth redistribution layer disposed on the third insulating layer.

17. The fan-out semiconductor package of claim 15, wherein the first insulating layer has a thickness greater than a thickness of the second insulating layer.

18. The fan-out semiconductor package of claim 10, wherein the first and second component-embedded substrates further a plurality of first vias penetrating through the substrates and connected to the first metal layers, respectively.

19. The fan-out semiconductor package of claim 5, wherein the first component-embedded substrate further includes a plurality of first vias penetrating through the substrate and connected to the first metal layer.

20. A fan-out semiconductor package, comprising:
a first connection member having a through-hole;
a semiconductor chip disposed in the through-hole of the first connection member and having an active surface including connection pads disposed thereon and an inactive surface opposite the active surface;
a component-embedded substrate disposed in the through-hole of the first connection member and spaced apart from the semiconductor chip, and including a passive component embedded therein;
an encapsulant encapsulating portions of the first connection member, the component-embedded substrate, and the semiconductor chip; and
a second connection member disposed on the first connection member, the component-embedded substrate, and the active surface of the semiconductor chip,
wherein the first connection member and the second connection member include, respectively, redistribution layers electrically connected to the connection pads of the semiconductor chip, and
the component-embedded substrate further an insulating layer disposed on the passive component and having opening exposing portions of the passive component, a wiring layer disposed on the insulating layer and connected to the passive component through vias filling the openings in the insulating layer,
the insulating layer includes an upper surface facing the passive component, a lower surface on which the wiring layer is disposed, and a side surface connecting the upper and lower surfaces to each other and being in contact with the encapsulant, and
the passive component is electrically connected to the connection pads of the semiconductor chip through the redistribution layer of the second connection member, and the wiring layer and the via of the component-embedded substrate.

21. The fan-out semiconductor package of claim 20, wherein the component-embedded substrate further includes a resin layer surrounding at least a portion of the passive components.

22. The fan-out semiconductor package of claim 21, wherein the component-embedded substrate further includes a substrate having a cavity,
the passive component is disposed in the cavity,
the resin layer fills at least a portion of the cavity, and
the passive component is spaced apart from the encapsulant at least by the resin layer and the substrate.

23. The fan-out semiconductor package of claim 22, wherein the component-embedded substrate further includes a metal layer disposed on the resin layer,
the passive component is spaced apart from the encapsulant also by the metal layer.

* * * * *